US009793378B2

(12) United States Patent
Loubet et al.

(10) Patent No.: US 9,793,378 B2
(45) Date of Patent: Oct. 17, 2017

(54) FIN FIELD EFFECT TRANSISTOR DEVICE WITH REDUCED OVERLAP CAPACITANCE AND ENHANCED MECHANICAL STABILITY

(71) Applicants: STMicroelectronics, Inc., Coppell, TX (US); International Business Machines Corporation, Armonk, NY (US)

(72) Inventors: Nicolas Loubet, Guilderland, NY (US); Shom Ponoth, Gaithersburg, MD (US); Prasanna Khare, Schenectady, NY (US); Qing Liu, Guilderland, NY (US); Balasubramanian Pranatharthiharan, Watervliet, NY (US)

(73) Assignees: STMicroelectronics, Inc., Coppell, TX (US); International Business Machines Corporation, Armonk, NY (US)

( * ) Notice: Subject to any disclaimer, the term of this patent is extended or adjusted under 35 U.S.C. 154(b) by 355 days.

(21) Appl. No.: 13/906,677

(22) Filed: May 31, 2013

(65) Prior Publication Data
US 2014/0353753 A1    Dec. 4, 2014

(51) Int. Cl.
*H01L 29/66* (2006.01)
*H01L 21/8234* (2006.01)
*H01L 27/088* (2006.01)
*H01L 29/78* (2006.01)

(52) U.S. Cl.
CPC ............... *H01L 29/66795* (2013.01); *H01L 21/823412* (2013.01); *H01L 21/823418* (2013.01); *H01L 21/823431* (2013.01); *H01L 27/0886* (2013.01); *H01L 29/785* (2013.01); *H01L 29/7848* (2013.01)

(58) Field of Classification Search
USPC .......................................... 257/347; 438/157
See application file for complete search history.

(56) References Cited

U.S. PATENT DOCUMENTS

| 6,812,075 | B2 | 11/2004 | Fried et al. |
| 7,612,420 | B2 | 11/2009 | Lenoble |
| 7,656,183 | B2 | 2/2010 | Hsu et al. |
| 7,687,356 | B2 | 3/2010 | Coronel et al. |

(Continued)

*Primary Examiner* — Hrayr A Sayadian
(74) *Attorney, Agent, or Firm* — Seed IP Law Group LLP

(57) ABSTRACT

Improved fin field effect transistor (FinFET) devices and methods for fabrication thereof. In one aspect, a method for fabricating a FinFET device comprises: a silicon substrate on which a silicon epitaxial layer is grown is provided. Sacrificial structures on the substrate are formed from the epitaxial layer. A blanket silicon layer is formed over the sacrificial structures and exposed substrate portions, the blanket silicon layer having upper and lower portions of uniform thickness and intermediate portions interposed between the upper and lower portions of non-uniform thickness and having an angle of formation. An array of semiconducting fins is formed from the blanket silicon layer and a non-conformal layer formed over the blanket layer. The sacrificial structures are removed and the resulting void filled with isolation structures under the channel regions. Source and drain are formed in the source/drain regions during a fin merge of the FinFET.

21 Claims, 10 Drawing Sheets

(56) References Cited

U.S. PATENT DOCUMENTS

| | | |
|---|---|---|
| 7,781,315 B2 | 8/2010 | Lenoble |
| 7,817,466 B2 | 10/2010 | Ferrant et al. |
| 7,923,337 B2 | 4/2011 | Chang et al. |
| 7,960,734 B2 | 6/2011 | Lenoble |
| 8,034,689 B2 | 10/2011 | Lenoble et al. |
| 8,183,078 B2 | 5/2012 | Ollier et al. |
| 8,294,508 B2 | 10/2012 | Wilson et al. |
| 8,410,527 B2 | 4/2013 | Pellizzer et al. |
| 8,759,874 B1 | 6/2014 | Loubet et al. |
| 2014/0353753 A1* | 12/2014 | Loubet .............. H01L 29/66795 257/347 |

* cited by examiner

FIN FIELD EFFECT TRANSISTOR DEVICE WITH REDUCED OVERLAP CAPACITANCE AND ENHANCED MECHANICAL STABILITY

TECHNICAL FIELD

The present disclosure relates to the fabrication of integrated circuit transistors, and in particular, to the fabrication of three-dimensional FinFET (Fin Field Effect Transistor) devices.

BACKGROUND

Due to their fast switching times and high current densities, fin field effect transistor (FinFET) devices are a desired device architecture. In its basic form, a FinFET device includes a source, a drain, and one or more fin-shaped channels between the source and the drain. A gate electrode over the fin regulates electron flow between the source and the drain.

In the semiconductor industry there is a continuing trend toward manufacturing integrated circuits (ICs) with higher densities. Accordingly, smaller feature sizes, smaller separations between features and more precise feature shapes are required in integrated circuits (ICs) fabricated on small rectangular portions of the wafer, commonly known as dies. This may include the width and spacing of interconnecting lines, spacing and diameter of contact holes, as well as the surface geometry of various other features (e.g., corners and edges). The scaling-down of integrated circuit dimensions can facilitate faster circuit performance and/or switching speeds, and can lead to higher cost efficiency in IC fabrication by providing more circuits on a die and/or more die per semiconductor wafer.

The architecture of a FinFET device, additionally, presents fabrication challenges. As device features become increasingly smaller (commensurate with current technology) accurately and consistently contacting the source and drain becomes a problem. Some previous FinFET devices have been on single fins, isolated devices or devices having a greatly relaxed pitch.

Moreover, as FinFET device sizes continue to shrink, parasitic capacitance effects may become noticeable and/or problematic. The overlap regions in which source and drain extension regions (LDD regions) overlap with the gate structure can give rise to "overlap capacitances" since the gate structure includes conductive layer(s) overlying dielectric material over a substrate, with the dielectric material situated between the gate structure and diffused conductive dopants in the substrate. The amount of overlap capacitance depends upon the area or degree of overlap between the gate structure and the diffused dopants. As the size of the gate structure is reduced, overlap capacitance becomes significant to reduced transistor performance.

BRIEF DESCRIPTION OF THE DRAWINGS

Example embodiments of the present disclosure will be described below with reference to the included drawings such that like reference numerals refer to like elements and in which.

DETAILED DESCRIPTION

Figure 1:
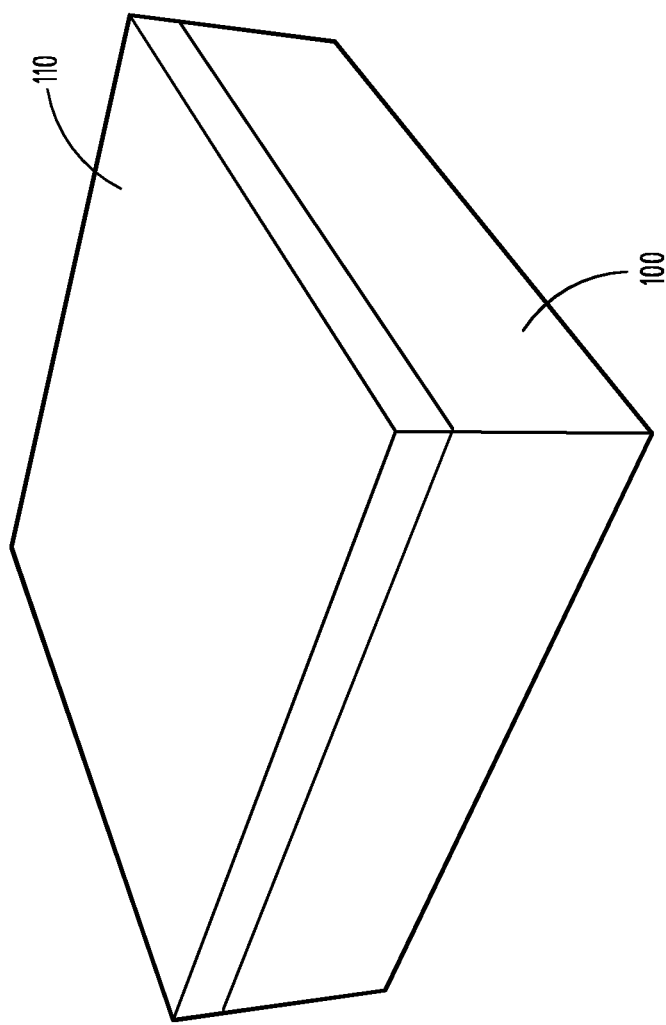
FIGS. 1-9 are diagrams illustrating an exemplary methodology for fabricating a fin field effect transistor (FinFET) device, in accordance with exemplary embodiments of the present disclosure.

For simplicity and clarity of illustration, reference numerals may be repeated among the figures to indicate corresponding or analogous elements. The sizes and relative positions of elements in the drawings are not necessarily drawn to scale. Numerous details are set forth to provide an understanding of the illustrative embodiments described herein. The embodiments may be practiced without these details. In other instances, well-known methods, procedures, and components have not been described in detail to avoid obscuring the disclosed embodiments. The description is not to be considered as limited to the scope of the exemplary embodiments shown and described herein.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically. The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

Reference throughout this document to "one embodiment", "certain embodiments", "an embodiment", "an example", "an implementation", "an example" or similar terms means that a particular feature, structure, or characteristic described in connection with the embodiment, example or implementation is included in at least one embodiment, example or implementation of the present invention. Thus, the appearances of such phrases or in various places throughout this specification are not necessarily all referring to the same embodiment, example or implementation. Furthermore, the particular features, structures, or characteristics may be combined in any suitable manner in one or more embodiments, examples or implementations without limitation.

Unless the context requires otherwise, throughout the specification and claims that follow, the word "comprise" and variations thereof, such as "comprises" and "comprising" are to be construed in an open, inclusive sense, that is, as "including, but not limited to."

In accordance with certain aspects of the present disclosure, a transistor has a silicon substrate; an array of isolation structures formed on the silicon substrate; an array of semiconducting fins, with each semiconducting fin of the array of semiconducting fins has channel regions of substantially uniform thickness formed from upper portions of a silicon layer and source/drain regions, a lower region of the source/drain regions formed from lower portions of substantially uniform thickness of the silicon layer and intermediate regions of the source/drain regions formed from intermediate portions of the silicon layer contiguous the upper and lower portions of the silicon layer, the intermediate regions of the source/drain regions characterized by an angle of formation from a top surface of an adjacent upper portion to a top surface of an adjacent lower portion, wherein the channel regions are formed over the isolation structures and the source/drain regions are formed on the silicon substrate; a conformal gate formed on the channel regions of the array of semiconducting fins, the gate operable to control current flow within the semiconducting fin in response to an applied voltage; and an epitaxial source and drain formed in the source/drain and channel regions of the array of semiconducting fins.

Consistent, then with a method of forming a transistor on a silicon substrate, as discussed herein, a method comprises: growing a silicon epitaxial layer from a silicon substrate; forming from the silicon epitaxial layer a plurality of sacrificial structures on the silicon substrate; depositing a blanket silicon layer over the plurality of sacrificial structures and exposed portions of the silicon substrate, the blanket silicon layer having upper portions of substantially uniform thickness formed over the plurality of sacrificial structures, lower portions of substantially uniform thickness formed over the exposed portions of the silicon substrate, and intermediate portions of non-uniform thickness each formed contiguous an upper portion and a lower portion and characterized by an angle of formation from a top surface of an adjacent upper portion to a top surface of an adjacent lower portion; forming an array of semiconducting fins from the blanket silicon layer, wherein each semiconducting fin of the array of semiconducting fins has channel regions formed from the upper portions of the blanket silicon layer and source/drain regions formed from the lower portions and the intermediate portions of the blanket silicon layer; selectively removing the plurality of sacrificial structures under the channel regions of the array of semiconducting fins to leave a void under the channel regions of the array of semiconducting fins; forming isolation structures in the void under the plurality of channel regions of the array of semiconducting fins; and depositing a conformal gate overlying the array of semiconducting fins on the plurality of channel regions of the array of semiconducting fins.

Therefore, in accordance with embodiments described herein, a method to form a FinFET structure with reduced overlap capacitance is provided. Reduced source/drain to gate capacitance leads to optimized AC characteristics and performance. Formation of the FinFET with isolation structures between the source/drain to gate allows for gate to gate distance to be reduced and better mechanical stability of the resultant transistor results.

Integrated circuits typically incorporate FETs in which current flows through a semiconducting channel between a source and a drain, in response to a voltage applied to a gate. A FinFET is an electronic switching device in which the planar semiconducting channel of a traditional FET is replaced by a semiconducting fin that extends outward, normal to the substrate surface. In such a device, the gate, which controls current flow in the fin, wraps around three sides of the fin so as to influence the current flow from three surfaces instead of one. As is known, an array of multiple transistors can be formed by conformally depositing a common gate over an array of fins. Furthermore, an array of multi-gate transistors can be formed by conformally depositing multiple common gates over the array of fins. Such a FinFET array having three gates between source and drain regions is known as a tri-gate transistor.

Referring to FIG. 1, silicon germanium (SiGe) epitaxy is performed on a silicon (Si) blanket substrate 100 to form a silicon epitaxial layer 110 from the silicon substrate. As used herein, the term epitaxy refers to a controlled process of crystal growth in which a new, epitaxial, layer of a crystal is grown from the surface of a bulk crystal, while maintaining the same crystal structure of the underlying bulk crystal. In this example, the silicon epitaxial layer 110 is a SiGe blanket formation over a silicon (Si) substrate 100. The epitaxial silicon compound used for the layer 110, for example, is silicon germanium (SiGe) in which the germanium content is within the range of about 35% to about 65%. The silicon substrate 100 may be a wafer, for example.

Figure 2:
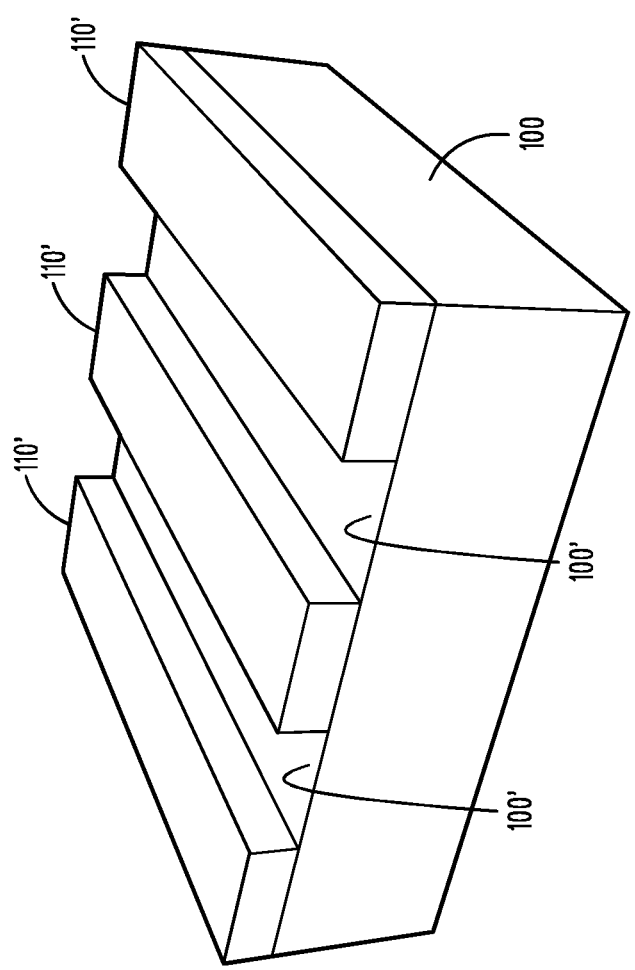

In FIG. 2, the SiGe layer 110 is patterned with a gate lithography process and etched to yield three sacrificial structures 110' from the SiGe layer 110 on the silicon substrate 100 as well as exposed portions 100' of silicon substrate 100, as shown. As will be shown, formation of these sacrificial structures 110' pave the way later for formation of isolation structures important in providing a device with improved mechanical stability. Because these regions are used as a temporary place holder, they are referred to as sacrificial structures.

The SiGe layer 110 may be patterned with a gate lithography process followed by etching of the patterned silicon epitaxial layer to form the sacrificial structures 110' on the silicon substrate 100. The patterning and subsequent etching may be accomplished using an optical lithography and etch process. Because conventional optical lithography is well-known to those skilled in the art of semiconductor processing, it is not explicitly shown in the figures, but will be described briefly. Conventional optical lithography entails spinning on a photoresist, exposing portions of the photoresist to ultraviolet light through a patterned mask, and developing away the unexposed portions of the photoresist, thereby transferring the mask pattern to the photoresist. The photoresist mask can then be used to etch the mask pattern into one or more underlying layers. Typically, a photoresist mask can be used if the subsequent etch is relatively shallow, because photoresist is likely to be consumed during the etch process. For example, silicon epitaxial layer 110 may be patterned with a gate lithography process and the patterned silicon epitaxial layer etched with a directed (anisotropic) plasma etch, also referred to as a reactive ion etch (RIE). Following the RIE etch, a standard wet chemical cleaning process can be used to remove residual photoresist.

The Si and SiGe layers are examples of epitaxial silicon compounds, a term that is not to be construed narrowly to limit an epitaxially grown structure to Si, SiGe, or SiC, for example. Rather, the term "epitaxial silicon compounds" is broadly construed to cover any compounds and materials that can be grown epitaxially from a silicon substrate.

Figure 3:
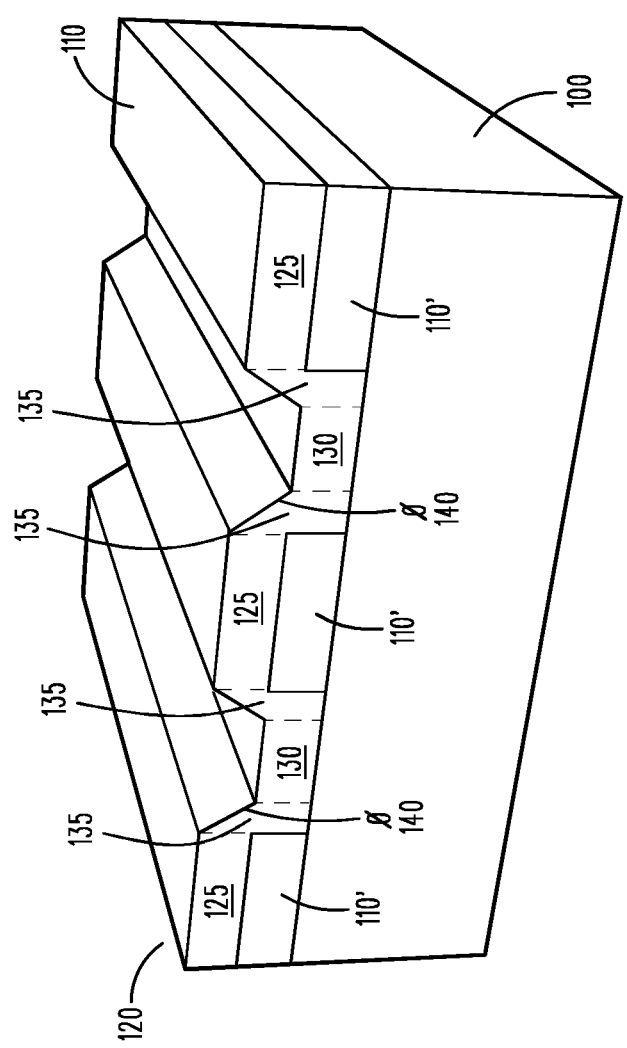

Next, as illustrated in FIG. 3, silicon is grown everywhere on the structure. As will be described and shown, this blanket silicon epitaxy Si layer 120 formed on top of the SiGe sacrificial structures 110' is the future transistor channel. As can be seen in the drawings, the blanket silicon layer 120 is conformal in the sense that there are upper portions 125 formed over the sacrificial structures 110', lower portions 130 formed over the exposed portions 100' of the silicon substrate 100, and intermediate portions 135 formed between contiguous upper and lower portions as shown. While upper portions 125 and lower portions 130 have substantially uniform vertical thicknesses, it can be seen that intermediate portions 135 do not. Intermediate portions 135 are formed over an area between a top surface of an adjacent upper portion to a top surface of an adjacent lower portion at an angle of formation 140. The angle of formation 140 of an intermediate portion 135 may be determined by a variety of factors, including the silicon crystal lattice of the blanket silicon layer, orientation of the channel, and the surface of the substrate. Changing one or more of these factors, may change the angle of formation 140. In a device having a vertical growth facet of 1:1:1, the angle of formation 140 may be approximately 54°. In this example, consider a surface having an orientation of (100) and a notch direction of the wafer oriented at <110>.

Figure 4:
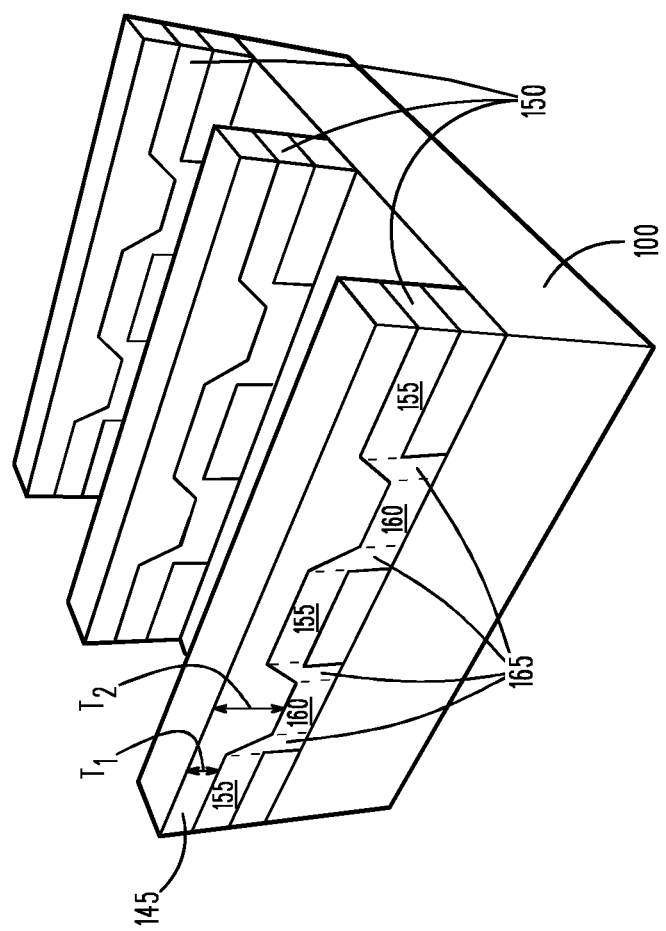

Next, in FIG. 4, the result of a hard mask and subsequent sidewall image transfer (SIT) process to a non-conformal layer is illustrated. Consider a non-conformal layer of silicon nitride (SiN) applied to the blanket silicon layer 120 of FIG. 3. A SiN hard mask selectively may be deposited over portions of the non-conformal and the hard mask patterned and portions of the non-conformal layer and the blanket silicon layer not protected by the hard mask selectively etched away. As an example, a sidewall image transfer (SIT) process may be applied to selectively etch away portions of the non-conformal layer and the blanket silicon layer not protected by the hard mask. While the hard mask is described as SiN, it may be formed of other materials, such as nitride. As is known, a hard mask technique is desirable when etching deep structures that require a longer etch time, because the nitride hard mask can withstand the etch process more reliably than a photoresist can.

The patterning and etching process yields an array of semiconducting fins 150 from the blanket silicon layer 120 overlaid with the non-conformal layer.

It can be seen that each semiconducting fin 150 of the array of semiconducting fins has channel regions 155 formed from the upper portions of the blanket silicon layer over the sacrificial structures 110' and source/drain regions 160 and 165 formed from the lower portions of the blanket silicon layer over the exposed silicon regions 100' and the intermediate portions of the blanket silicon layer, respectively, also formed over exposed silicon regions 100'.

It can be readily understood that the thickness of the non-conformal layer 145 over these semiconducting fins 150 varies. The thickness of the nonconformal layer 145 is thickest and substantially uniform over the source/drain region 160, indicated by thickness T2, while the thickness of the nonconformal layer 145 is thinnest and also substantially uniform over the channel region 155, indicated by thickness T1. For example, the thickness of T2 may be approximately 60 nm while the thickness of T1 may be approximately half that, or 30 nm. The thickness of the nonconformal layer over the source/drain region 165 formed from the intermediate portions of the blanket silicon layer varies and is non-uniform, and is determined by the angle of formation 140 of the source/drain region over which it is formed. A thicker portion of the non-conformal layer 145 in the source/drain regions can help protect the silicon during the SIT so that only the Si and SiGe below the gate is etched.

Figure 5:
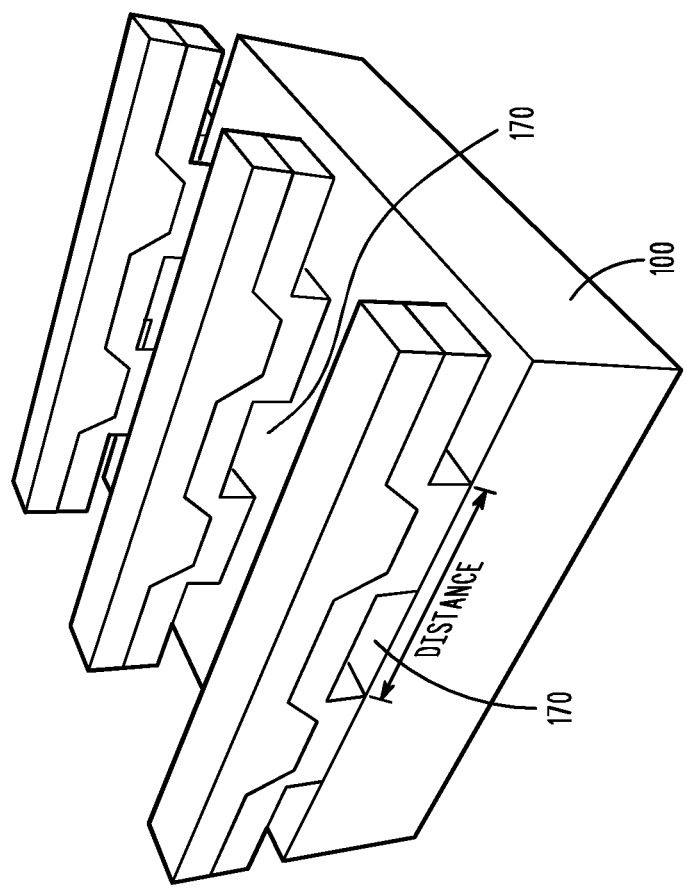

Next, as illustrated in FIG. 5, selective removal of the SiGe sacrificial structures 110' under the channel regions 155 of the semiconducting fins leaves a void 170 under the channel regions that may then be filled with isolating structures that provide enhanced dielectric isolation of the finished device. As illustrated in FIG. 5, the distance from gate to gate may be as low as 20 nm. Contrast this with a typical distance gate-to-gate distance of 30 nm to 200 nm, for example, that may result from other fabrication techniques. Sacrificial etch or oxidation may be used to remove the SiGe for source or drain dielectric isolation formation.

Figure 6:
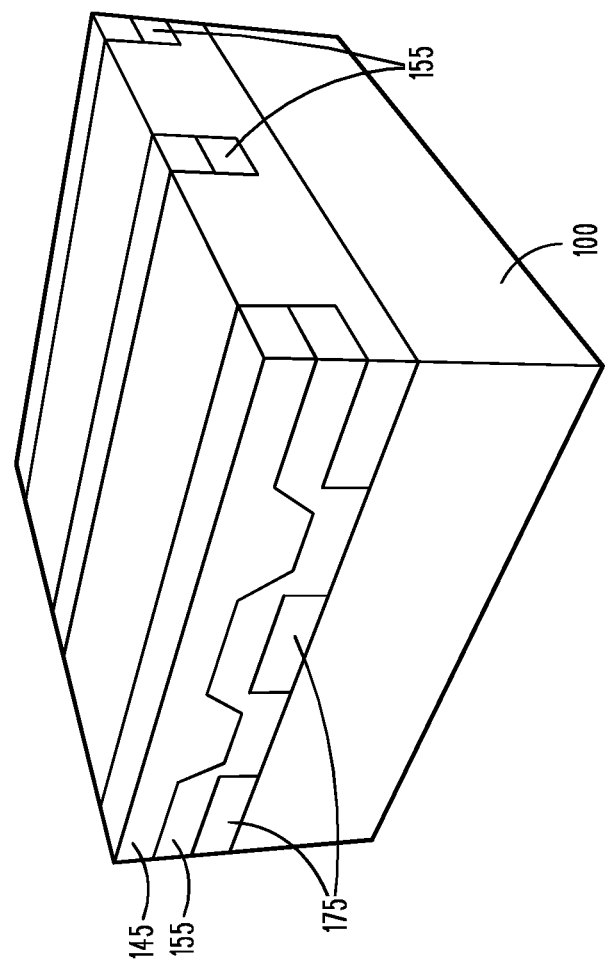
Figure 7:
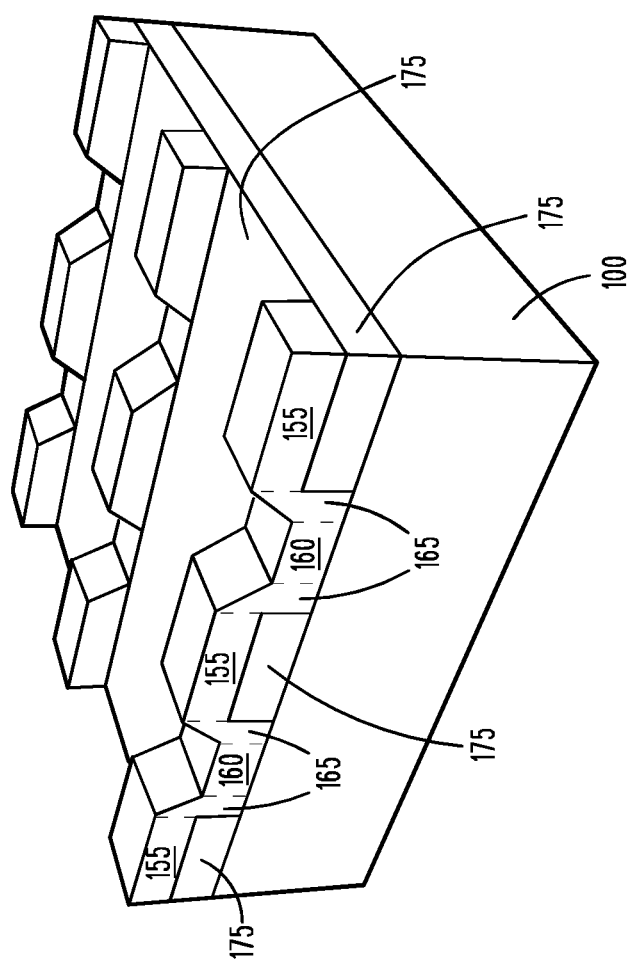

FIGS. 6 and 7 illustrates formation of isolation structures in these voids 170. An isolation material such as silicon dioxide (SiO2) is deposited onto the structure in the voids 170. The deposited SiO2 is planarized with the non-conformal layer 145 as shown. Planarizing the deposited SiO2 isolation material may be accomplished using chemical mechanical planarization (CMP) to make the isolation material planar with the non-conformal layer. The non-conformal layer 145 is removed and isolation material SiO2 is recessed to be planar under the channel regions 155 of the fins 150 as shown. The SiN non-conformal layer may be selectively removed with H3PO4. The SiO2 isolation material may be recessed with a dry or wet chemistry such as hydrofluoric acid (HF).

Non-conformal layer 145 has been removed as well selective removal of material 175 from FIG. 6. Removal of non-conformal layer 145 may occur at the same time or after formation of the isolation structures 175 in void 170.

Figure 8:
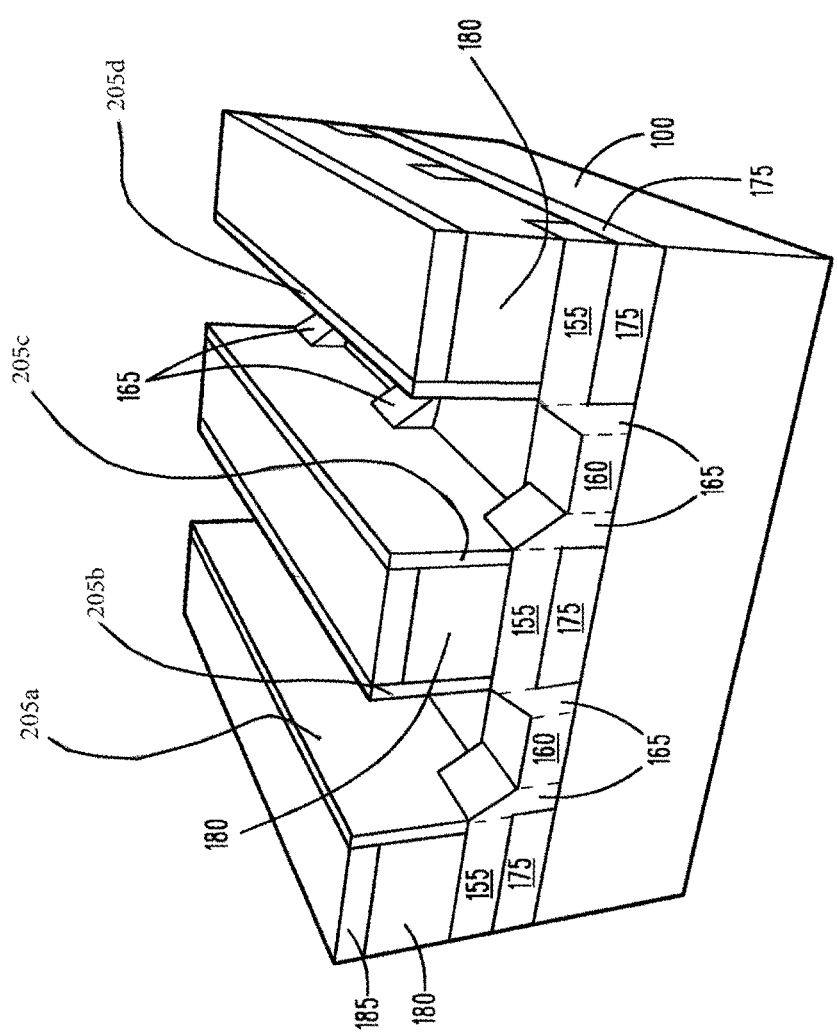

The gate stack of the FinFET transistor device is deposited and patterned in FIG. 8. This is accomplished by depositing a conformal gate overlying the array of semiconducting fins on the channel regions of the semiconducting fins. The conformal gate or gate stack has a gate dielectric material and a bulk gate material 180 formed over channel region 155 of the fin. The conformal gate dielectric material and bulk gate material 180 is at least partially contiguous to three sides of each semiconducting fin so that a voltage operatively applied to the gate influences current flow within the semiconducting fin. Composition of the gate dielectric material can be silicon dioxide, having a dielectric constant of about 4.0, or, more desirably, the gate dielectric can be a high dielectric constant (high K) material having a dielectric constant in the range of about 5.0-10.0 or higher. Such high dielectric constant materials include, for example, hafnium oxides and hafnium silicates.

Depositing the conformal gate on the channel regions 155 further comprises depositing a dielectric hard mask over the top the bulk gate material 180 and sidewall spacers 205a-205d next to the bulk gate material 180.

The hard mask may be a nitride hard mask or a silicon nitride hard mask. The hard mask material and bulk gate material may be patterned and etched using an optical lithography and etch process, as previously described. For example, they may be patterned with a lithography process and etched with a reactive ion etch (RIE).

Composition of a bulk gate material forming the gate 180 may include a work function metal alloy, for example, tantalum nitride (TaN), titanium nitride (TiN), or titanium aluminum (TiAl). The bulk gate material may be polysilicon. A conventional metal deposition process can be used to deposit the gate 180, such as CVD, PVD, an electroplating process, or an electro-less plating process. Alternatively, a conventional polysilicon gate 180 can be deposited. The gate dielectric and the gate 180, together, wrap around the fins so that they are at least partially contiguous to three sides of each semiconducting fin. The gate 180 thus is operable to control current flow within the semiconducting fin in response to an applied voltage. Though not shown, bulk gate material 180 may be formed on an oxide layer.

Figure 9:
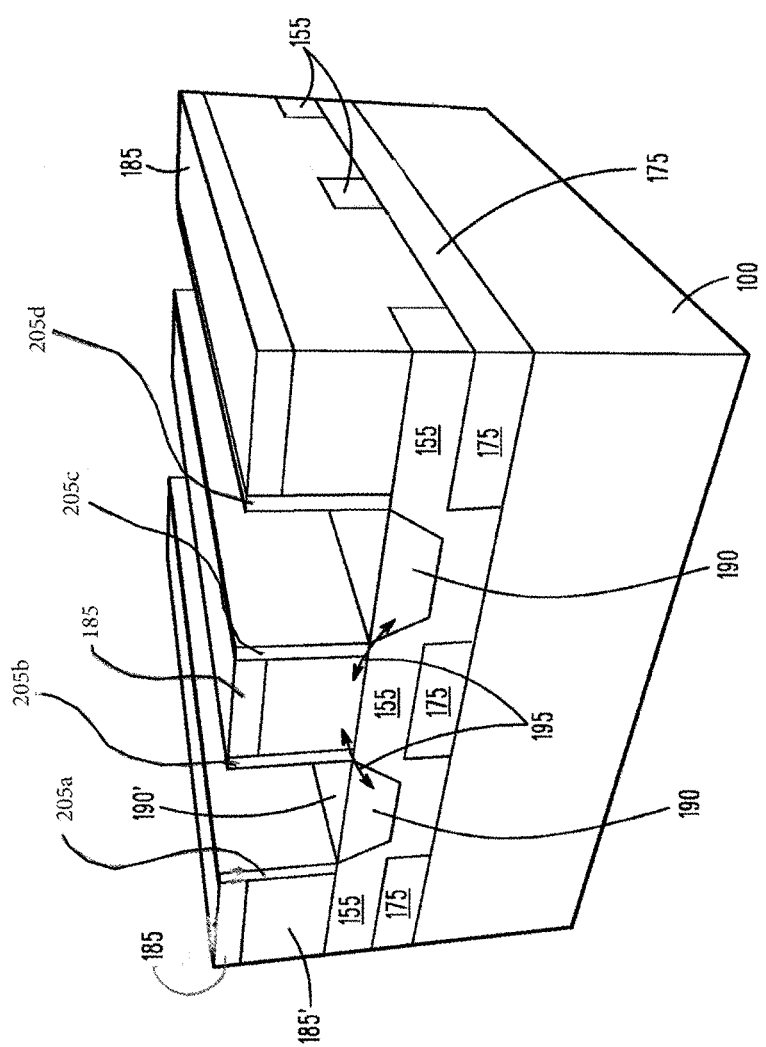

Finally, in FIG. 9, growth of an epitaxial source and drain 190 from the source/drain regions 160, 165 of the semiconducting fins accomplishes a merge of the array of fins of the device. A pre-clean can be performed to remove residual oxide, including native oxide, from the silicon surface o prepare the silicon surface for epitaxial growth. The source and drain can be grown epitaxially from the silicon surface, directly after the pre-clean. The presence of a pristine crystalline structure, such as 100 crystalline structure, at the silicon surface tends to facilitate epitaxial growth. There are many possible choices for the composition of the epitaxial raised source and drain, for example, epitaxial silicon, an in-situ-doped epitaxial SiGe layer, or an implanted epitaxial SiC layer, among others. Formation of the source/drain structure completes the FinFET device.

The epitaxial source and drain 190, which is SiGe in this example, is formed below the stacked gate 185 so that a top surface 190' of the source and drain 190 is substantially co-planar with a bottom surface 185' of the stacked conformal gate 185. The epitaxial source and drain 190 may be doped source and drain structures that extend above the surface of the silicon substrate.

The fin merge may be accomplished by silicon germanium Boron (SiGeB) epitaxial growth in the case of a PFET FinFET device, for example, or by silicon carbide phosphorous (SiCP) epitaxial growth in the case of an NFET FinFET device.

There are significant advantages to be realized from the resultant transistor structure shown in FIG. 9. The formation of the SiGe source and drain 190 over the Si fins allows strain in the structure to be maximized. Introducing compressive strain into the transistor materials tends to increase charge mobility, resulting in a faster switching response to changes in voltage applied to the gate. Strain can be introduced, for example, by replacing bulk silicon in the source and drain regions, or in the channel itself, with epitaxially-grown silicon compounds, as is the case here.

Moreover, a low source to gate and drain to gate capacitance 195 is realized as the formation of the epitaxial source and drain 190 during fin merge does not overlap the transistor spacer 185.

Figure 10:
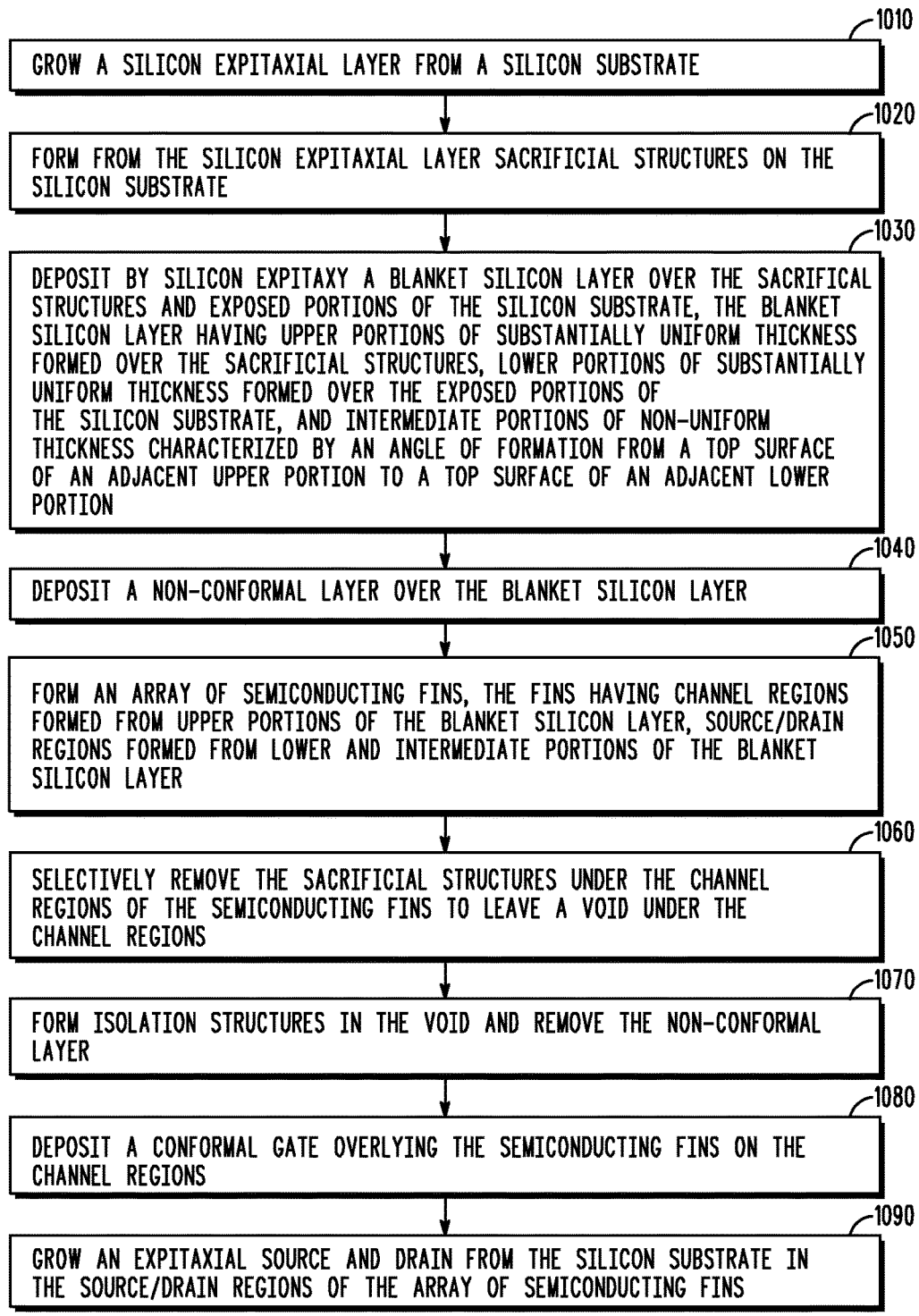
FIG. 10 is a process flow diagram illustrating formation of a FinFET device described herein, in accordance with exemplary embodiments of the present disclosure.

FIG. 10 is a flow chart of a method 1000 of forming a FinFET structure with reduced overlap capacitance and improved mechanical stability. Referring now to Block 1010, a silicon epitaxial layer is grown from a silicon substrate, as illustrated and discussed in connection with FIG. 1. At Block 1020, sacrificial structures are formed on the silicon substrate from the grown silicon epitaxial layer, as illustrated and discussed in connection with FIG. 2. Next, a silicon epitaxy a blanket silicon layer is deposited over the sacrificial structures and exposed portions of the silicon substrate at Block 1030. The blanket silicon layer has upper portions of substantially uniform thickness formed over the sacrificial structures, lower portions of substantially uniform thickness formed over the exposed portions of the silicon substrate, and intermediate portions of non-uniform thickness. The intermediate portions are characterized by an angle of formation from a top surface of an adjacent upper portion to a top surface of an adjacent lower portion. This is illustrated and discussed in connection with FIG. 3. Next, at Block 1040, a non-conformal layer is deposited over the blanket silicon layer followed by the formation of an array of semiconducting fins at Block 1050, as illustrated and described in connection with FIG. 4. The fins have channel regions formed from upper portions of the blanket silicon layer, source/drain regions formed from lower portions of the blanket silicon layer, and from intermediate portions of the blanket silicon layer. At Block 1060, the sacrificial structures formed at Block 1020 are selectively removed from under the channel regions of the semiconducting fins, leaving a void under the channel regions, as illustrated and described in connection with FIG. 5. Isolation structures are formed in the void and the non-conformal layer remaining on top of the formed fins is removed at Block 1070, as described and illustrated with regard to FIGS. 6 and 7. At Block 1080, a conformal gate overlaying the semiconducting fins is deposited on the channel regions of the fins. This gate stack deposition and patterning is illustrated and described in connection with FIG. 8. Finally, at Block 1090, a fin merge is performed, resulting in a finished FinFET device. As illustrated and described in connection with FIG. 9, an epitaxial source and drain from the silicon substrate is grown in the source/drain regions of the array of semiconducting fins, with the epitaxial source and drain being substantially co-planar with the channel of the FinFET in that a top surface of the epitaxial source and drain may be substantially co-planar with a bottom surface of the conformal gate, as shown.

The implementations of the present disclosure described above are intended to be merely exemplary. It will be appreciated by those of skill in the art that alterations, modifications and variations to the illustrative embodiments disclosed herein may be made without departing from the scope of the present disclosure. Moreover, selected features from one or more of the above-described exemplary embodiments may be combined to create alternative embodiments not explicitly shown and described herein.

The present disclosure may be embodied in other specific forms without departing from its spirit or essential characteristics. The described exemplary embodiments are to be considered in all respects only as illustrative and not restrictive. The scope of the disclosure is, therefore, indicated by the appended claims rather than by the foregoing description. All changes that come within the meaning and range of equivalency of the claims are to be embraced within their scope.

What is claimed is:

1. A semiconductor device comprising:
   a silicon substrate;
   an array of semiconductor fins formed on the silicon substrate, each semiconductor fin including:
      a blanket silicon layer over the silicon substrate, the blanket silicon layer having lower portions, upper portions, and intermediate portions, the intermediate portions being contiguous with and between the lower and upper portions, and having a transitional upper surface set at an angle with respect to upper surfaces of the lower and upper portions;
      channels of substantially uniform thickness being defined in the upper portions;
      source regions of substantially uniform thickness being defined in the lower and intermediate portions; and
      drain regions of substantially uniform thickness being defined in the lower and intermediate portions;
   an array of isolation structures between the upper portions and the silicon substrate, the channels of substantially uniform thickness being over, and aligned with, the array of isolation structures;
   a gate over the channels, the gate configured to control current flow within the channels in response to an applied voltage; and
   epitaxial raised sources and drains over the source regions and drain regions, respectively.

2. The semiconductor device of claim 1 wherein the gate includes a bulk gate material and a gate dielectric material at least partially contiguous to three sides of the channels.

3. The semiconductor device of claim 1 wherein the gate includes a first bottom surface on the channel and a second bottom surface on the isolation structures, an upper surface of the epitaxial source and drain layers is substantially co-planar with the first bottom surface of the gate.

4. The semiconductor device of claim 2 wherein the bulk gate material includes polysilicon.

5. The semiconductor device of claim 2 wherein the bulk gate material includes one or more of tantalum nitride, titanium nitride, or titanium aluminum.

6. The semiconductor device of claim 1 wherein the epitaxial raised sources and drains include doped source and drain structures extending above the silicon substrate.

7. The semiconductor device of claim 1 wherein the array of semiconductor fins includes one or more of epitaxial silicon or an epitaxial silicon compound.

8. A semiconductor device comprising:
a silicon substrate;
an epitaxial silicon layer over the silicon substrate and having lower portions, upper portions, and intermediate portions, contiguous with and between the lower and upper portions, and having a transitional upper surface set at an angle with respect to upper surfaces of the lower and upper portions;
an array of isolation structures between the epitaxial silicon layer and the silicon substrate;
an array of semiconductor fins, comprising:
channels of substantially uniform thickness being defined in the upper portions of said epitaxial silicon layer and being over and aligned with said array of isolation structures;
source regions of substantially uniform thickness in the lower and intermediate portions of the epitaxial silicon layer;
drain regions of substantially uniform thickness in the lower and intermediate portions of said epitaxial silicon layer;
a gate over the channels of the array of semiconductor fins, the gate configured to control current flow within the channels in response to an applied voltage; and
epitaxial silicon-germanium raised sources and drains over the source regions and drain regions, respectively.

9. The semiconductor device of claim 8 wherein the gate includes a bulk gate material and a gate dielectric material that are at least partially contiguous to three sides of the channels.

10. The semiconductor device of claim 8 wherein the gate includes a first bottom surface on the channel and a second bottom surface on the isolation structures, an upper surface of the epitaxial silicon-germanium source and drain layers is substantially co-planar with the first bottom surface of the gate.

11. The semiconductor device of claim 9 wherein the bulk gate material includes polysilicon.

12. The semiconductor device of claim 9 wherein the bulk gate material includes one or more of tantalum nitride, titanium nitride, or titanium aluminum.

13. The semiconductor device of claim 8 wherein the array of semiconductor fins includes one or more of epitaxial silicon or an epitaxial silicon compound.

14. A semiconductor device comprising:
a silicon substrate;
an epitaxial silicon layer over the silicon substrate, the epitaxial silicon layer having lower portions, upper portions, and intermediate portions being contiguous with and between the lower and upper portions and having a transitional upper surface set at an angle with respect to upper surfaces of the lower and upper portions;
an array of isolation structures between the upper portions layer and the silicon substrate;
an array of semiconductor fins including:
channels of substantially uniform thickness being defined in the upper portions of said epitaxial silicon layer and being over and aligned with said array of isolation structures; and
sources and drains of substantially uniform thickness being defined in the lower and intermediate portions of said epitaxial silicon layer;
a gate over the channels of the array of semiconductor fins, the gate configured to control current flow within the array of semiconductor fins in response to an applied voltage; and
epitaxial silicon-germanium source and drain layers over the source and drain, respectively, and including doped source and drain structures extending above the silicon substrate.

15. The semiconductor device of claim 14 wherein the gate includes a bulk gate material and a gate dielectric material that are at least partially contiguous to three sides of the channels.

16. The semiconductor device of claim 14 wherein the gate includes a first bottom surface on the channel and a second bottom surface on the isolation structures, an upper surface of the epitaxial silicon-germanium source and drain layers is substantially co-planar with the first bottom surface of the gate.

17. The semiconductor device of claim 15 wherein the bulk gate material includes polysilicon.

18. The semiconductor device of claim 15 wherein the bulk gate material includes one or more of tantalum nitride, titanium nitride, or titanium aluminum.

19. The semiconductor device of claim 14 wherein the array of semiconductor fins includes one or more of epitaxial silicon or an epitaxial silicon compound.

20. A FinFET, comprising:
a silicon substrate;
a fin extending above the silicon substrate, the fin including:
a patterned oxide layer;
a blanket semiconductor layer overlying the patterned oxide layer, the blanket semiconductor layer having lower portions, upper portions, intermediate portions between the lower and upper portions, and a transitional upper surface set at an angle with respect to upper surfaces of the lower and upper portions, the patterned oxide layer positioned between the upper portions and the silicon substrate;
a source region in one of the lower portions;
a drain region in one of the lower portions; and
a channel in one of the upper portions; and
a gate that wraps around three sides of the channel.

21. The FinFET of claim 20, further comprising spacers in contact with sidewalls of the gate;
an epitaxial raised source in abutting contact with the source region; and
an epitaxial raised drain in abutting contact with the drain region, the epitaxial source and drain not overlapping the spacers.

* * * * *